(12) United States Patent
Parris

(10) Patent No.: US 8,976,572 B2
(45) Date of Patent: Mar. 10, 2015

(54) DRAM SECURITY ERASE

(71) Applicant: Tessera, Inc., San Jose, CA (US)

(72) Inventor: Michael C. Parris, Colorado Springs, CO (US)

(73) Assignee: Tessera, Inc., San Jose, CA (US)

( * ) Notice: Subject to any disclaimer, the term of this patent is extended or adjusted under 35 U.S.C. 154(b) by 0 days.

(21) Appl. No.: 14/199,156

(22) Filed: Mar. 6, 2014

(65) Prior Publication Data

US 2014/0185402 A1 Jul. 3, 2014

Related U.S. Application Data

(63) Continuation of application No. 13/291,297, filed on Nov. 8, 2011, now Pat. No. 8,699,263.

(30) Foreign Application Priority Data

Aug. 31, 2011 (KR) .......................... 10-2011-0087736

(51) Int. Cl.
*G11C 11/24* (2006.01)
*G11C 11/407* (2006.01)
(Continued)

(52) U.S. Cl.
CPC .......... *G11C 11/407* (2013.01); *G11C 11/4072* (2013.01); *G11C 11/4078* (2013.01); *G11C 11/4094* (2013.01)
USPC ........................ 365/149; 365/185.29; 365/205

(58) Field of Classification Search
CPC ....... G11C 11/5642; G11C 16/28; G11C 7/06
USPC ..................................... 365/149, 185.29, 205
See application file for complete search history.

(56) References Cited

U.S. PATENT DOCUMENTS 4,873,672 A 10/1989 Etoh et al.
5,255,223 A 10/1993 Tanaka et al.
(Continued)

FOREIGN PATENT DOCUMENTS

EP 0430614 A2 6/1991
EP 0617428 A1 9/1994
(Continued)

OTHER PUBLICATIONS

International Search Report for Application No. PCT/US2011/059920, dated Mar. 1, 2012.

*Primary Examiner* — Tuan T Nguyen
(74) *Attorney, Agent, or Firm* — Lerner, David, Littenberg, Krumholz & Mentlik, LLP

(57) ABSTRACT

A memory includes a DRAM array having memory cells, wordlines and bitlines coupled to the memory cells, and sense amplifiers. The memory can be configured to perform a method in which a wordline of the DRAM array is set to an active state. While the wordline is active, signals develop on the respective bitlines according to the flows of charge between the memory cells coupled to the wordline and the respective bitlines. The sense amplifiers connected to the respective bitlines can remain inactive such that the sense amplifiers do not amplify the signals to storable signal levels. Then, when the wordline is set again to the inactive state, insufficient charge remains in the memory cells coupled to the wordline such that the data stored in memory cells coupled to the wordline are erased. These steps can be repeated using each of a remaining number of wordlines of all or a selected range of the DRAM array so as to erase the data stored in all of the DRAM array or a selected range.

20 Claims, 7 Drawing Sheets

(51) Int. Cl.
*G11C 11/4072* (2006.01)
*G11C 11/4078* (2006.01)
*G11C 11/4094* (2006.01)

(56) References Cited

U.S. PATENT DOCUMENTS

| | | | |
|---|---|---|---|
| 6,958,937 B2 | 10/2005 | Forbes | |
| 7,164,611 B2 | 1/2007 | Kinsley | |
| 7,751,263 B2 | 7/2010 | Kinsley | |
| 8,699,263 B2 * | 4/2014 | Parris | 365/149 |
| 2004/0160830 A1 * | 8/2004 | Forbes | 365/185.28 |
| 2004/0190342 A1 * | 9/2004 | Forbes | 365/185.25 |
| 2005/0036370 A1 * | 2/2005 | Forbes | 365/189.01 |
| 2005/0094453 A1 | 5/2005 | Forbes | |
| 2006/0146589 A1 | 7/2006 | Karlsson et al. | |
| 2006/0274580 A1 | 12/2006 | Forbes | |
| 2008/0198654 A1 | 8/2008 | Toda | |
| 2009/0016133 A1 | 1/2009 | Kobayashi | |

FOREIGN PATENT DOCUMENTS

| | | |
|---|---|---|
| KR | 20090105093 A | 10/2009 |
| KR | 100990468 B1 | 10/2010 |
| KR | 101003493 B1 | 12/2010 |

* cited by examiner

DRAM SECURITY ERASE

CROSS-REFERENCE TO RELATED APPLICATIONS

The present application is a Continuation of U.S. patent application Ser. No. 13/291,297, filed Nov. 8, 2011, which claims priority from Korean Application No. 10-2011-0087736 filed Aug. 31, 2011, the disclosures of which are hereby incorporated herein by reference.

BACKGROUND OF THE INVENTION

The subject matter of the present application relates to dynamic random access memories ("DRAMs") which typically are embodied as a specific DRAM chip for that purpose, or as a DRAM macro functional unit embodied within another type of chip which may also include a substantial amount of logic circuitry. More specifically, the present application relates to a method of erasing data stored within a DRAM.

Microelectronic elements, e.g., semiconductor chips, are thin, flat elements which can incorporate integrated circuits including active semiconductor devices such as transistors, diodes, etc., and wiring which provides electrical interconnections. Semiconductor chips may also or alternatively include passive devices such as capacitors, inductors or resistors. In particular constructions, a microelectronic element can include one or more semiconductor chips having an encapsulant on one or more surfaces thereof and having electrically conductive elements electrically connected with contacts of the one or more semiconductor chips, the contacts being exposed at a surface of the microelectronic element. In some cases, a microelectronic element can be a fan-out wafer level microelectronic unit containing one or more semiconductor chips in which an encapsulant covers at least edges of the one or more semiconductor chips, and in which electrically conductive traces extend along a surface of the one or more chips and onto a surface of the encapsulant beyond an edge of one or more chips.

A semiconductor chip can embody a dynamic random access memory (hereinafter "DRAM chip" or "DRAM") having a memory storage array and circuitry for writing data to the storage array and reading the data stored therein. In operation of a typical conventional DRAM, data is written to and read from memory cells of the storage array by storing a high voltage or a low voltage on a storage capacitor of each memory cell. The high voltage typically represents a stored "1" and the low voltage typically represents a stored "0" in a binary data scheme. DRAMs are volatile memory, such that data remains stored on the storage capacitors therein so long as the DRAM remains powered on and is refreshed at required intervals. When power is removed from the DRAM, refreshing is no longer performed, and the voltage levels stored on the storage capacitors begin to decay. However, the data stored on the storage capacitors does not disappear immediately. Instead, the DRAM may need to remain powered off for several minutes before one can be sure that the stored data is erased.

In typical computing systems such as desktop, laptop, or tablet computers, and smartphones, one or more DRAM chips are used to provide active system memory for enabling active system operations for sound and display processing and a myriad of both built-in and user-selected add-on application programs or "apps", e.g., for Internet access, media or music access, word processing, database access, presentations, and many others. For security, data stored in non-volatile disk drives or solid-state memory drives in computing systems can be encrypted. However, data used in active operation of the computing system, which is stored in active system memory, is not encrypted.

Because of the way DRAM chips operate as described above, data in active system memory therein can persist for several minutes even after the computing system is powered down. Thus, even when a laptop or smartphone computing system is powered down and then left unattended, or is placed in others' possession, such as when the user undergoes airport screening, there is a risk that a clever thief who steals the computing system could gain access to sensitive data that still persists in the computing system's DRAM-based active system memory.

Thus, it would be desirable to quickly erase the data stored in DRAM chips. This could help protect against theft of data from a computing system's active system memory. However, conventional DRAM chips do not provide a reliable way of quickly erasing data. When data needs to be erased, typical DRAM chips employ a conventional write operation to overwrite the data already stored therein with high or low voltages, or some pattern of high and low voltages. As a result, erasing the data in an entire DRAM chip can take as much time and resources to perform as it would to write data to fill the entire DRAM chip.

Ways of erasing data in DRAM chips are among the description provided by the following references: U.S. Pat. No. 7,751,263; 7,164,611; 5,255,223; 4,873,672; U.S. Pat. Pub. 20090016133; and Korean Pat. Pub. 2009-0105093.

SUMMARY OF THE INVENTION

In accordance with an aspect of the invention, a method is provided for erasing data stored in a dynamic random access memory (DRAM) array. Such method can include: setting a wordline of the DRAM array to an active state, thereby causing charge to flow between memory cells coupled to the wordline and respective bitlines according to the data stored in the memory cells, wherein signals develop on the respective bitlines according to the flows of charge between the memory cells coupled to the wordline and the respective bitlines. While maintaining sense amplifiers connected to the respective bitlines in inactive states in which the sense amplifiers do not amplify the signals to storable signal levels, the wordline can be set to an inactive state such that insufficient charge remains in the memory cells coupled to the wordline, thereby erasing the data stored in the memory cells coupled to the wordline. The above-described steps can be repeated using each of a remaining number of wordlines of a selected range of the memory array so as to erase the data stored in the selected range.

In one example, the selected range can be the entire memory array, so as to erase the data stored in the entire memory array. Alternatively, the selected range can be less than the entire memory array. The selected range can be contiguous, or in some cases, may be non-contiguous. For example, the data stored in memory cells coupled to each wordline selected out of two wordlines, or every three wordlines, or every four wordlines in a particular address range can be erased, while not erasing the data stored in memory cells coupled to the wordlines that lie between the selected wordlines. In another example, the data stored in memory cells coupled to three wordline selected out of every four wordlines is erased, while not erasing the data in memory cells coupled to the non-selected wordline out of every four wordlines within a particular address range.

In one example, the step of setting the wordline to an active state can include selecting the wordline using an address counter. In a particular example, the address counter can be a refresh address counter.

The method may further include precharging the bitlines to a first voltage level prior to the step of setting the wordline to the active state. In a particular example, the first voltage level can be an intermediate level between a high signal voltage level and a low signal voltage level at which "1"s and "0"s, respectively, are stored in the memory cells coupled to the wordline. In a particular example, the step of precharging the bitlines can be performed by setting precharge devices connected to the bitlines to active states. In such case, the method may further include maintaining precharge devices connected to the bitlines in inactive states during the maintaining of the sense amplifiers in the inactive states and the setting of the selected wordline back to the inactive state.

In a particular example, the data storage elements include capacitors.

Another aspect of the invention provides another method of erasing data stored in a dynamic random access memory (DRAM) array. In such method, while maintaining precharge devices coupled to bitlines of the DRAM array in active states in which the bitlines are charged to one or more predetermined voltage levels, a wordline of the DRAM array can be set to an active state, such that voltages in memory cells coupled to the wordline are charged towards the one or more predetermined voltage levels regardless of the data stored in the memory cells. While maintaining sense amplifiers connected to the bitlines in inactive states the wordline can be set to an inactive state such that the memory cells store charge according to the one or more predetermined voltage levels, thereby erasing the data stored in the memory cells. Thus, the memory cells coupled to the wordline that is in the active state will store charge according to the one or more predetermined voltage levels at which the bitlines are precharged, rather than the voltage levels which they may have stored prior to such operation. The above-described steps can be repeated using each of a remaining number of wordlines of a selected range of the memory array so as to erase the data stored in the selected range.

In one example, the selected range can be the entire memory array, so as to erase the data stored in the entire memory array. Alternatively, the selected range can be less than the entire memory array, in the same manner as described above.

In one example, the step of setting the wordline to an active state can include selecting the wordline using an address counter. In a particular example, the address counter can be a refresh address counter.

The predetermined voltage level can be a single predetermined voltage level to which all bitlines are precharged. In another example, some bitlines can be precharged to one predetermined voltage level and other bitlines can be precharged to another predetermined voltage level. In one example, a predetermined voltage level used in this method can correspond to a reference voltage level. The predetermined voltage level may be the reference voltage level, such as ground, or other reference voltage level for use in an integrated circuit in which the memory is provided. In another example, a predetermined voltage level in this method may be an intermediate level approximately equal to an average of the supply voltage level and the reference voltage level, or may be an intermediate voltage level which corresponds to an average of the supply voltage level and the reference voltage level.

In a particular example, the data storage elements may include capacitors.

In accordance with another aspect of the invention, a memory is provided which includes a dynamic random access memory (DRAM) array, the DRAM array having memory cells, wordlines and bitlines coupled to the memory cells, and sense amplifiers. Such method may include: maintaining precharge devices coupled to bitlines of the DRAM array in active states in which the bitlines are charged to one or more predetermined voltage levels, a wordline of the DRAM array can be set to an active state, such that voltages in memory cells coupled to the wordline are charged towards the one or more predetermined voltage levels regardless of the data stored in the memory cells. While maintaining sense amplifiers connected to the bitlines in inactive states the wordline can be set to an inactive state such that the memory cells store charge according to the one or more predetermined voltage levels, thereby erasing the data stored in the memory cells. Thus, the memory cells coupled to the wordline that is in the active state will store charge according to the one or more predetermined voltage levels at which the bitlines are precharged, rather than the voltage levels which they may have stored prior to such operation. The above-described steps can be repeated using each of a remaining number of wordlines of a selected range of the memory array so as to erase the data stored in the selected range.

In one example, the selected range can be the entire memory array, so as to erase the data stored in the entire memory array. Alternatively, the selected range can be less than the entire memory array, in the same manner as described above.

In one example, the step of setting the wordline to an active state can include selecting the wordline using an address counter. In a particular example, the address counter can be a refresh address counter.

The predetermined voltage level can be a single predetermined voltage level to which all bitlines are precharged. In another example, some bitlines can be precharged to a first predetermined voltage level and other bitlines can be precharged to a second predetermined voltage level different from the first predetermined voltage level. In one example, a predetermined voltage level used in this method can correspond to a reference voltage level. The predetermined voltage level may be the reference voltage level, such as ground, or other reference voltage level for use in an integrated circuit in which the memory is provided. In another example, a predetermined voltage level in this method may be an intermediate level approximately equal to an average of the supply voltage level and the reference voltage level, or may be an intermediate voltage level which corresponds to an average of the supply voltage level and the reference voltage level.

In a particular example, the data storage elements may include capacitors.

A system according to an aspect of the invention can include a chip, e.g., a semiconductor chip incorporating a memory in accordance with an aspect of the invention as set forth above, and one or more other electronic components electrically connected to the chip. Such system may further include a housing, wherein the chip and the other electronic components are mounted to the housing.

DETAILED DESCRIPTION

Figure 1:
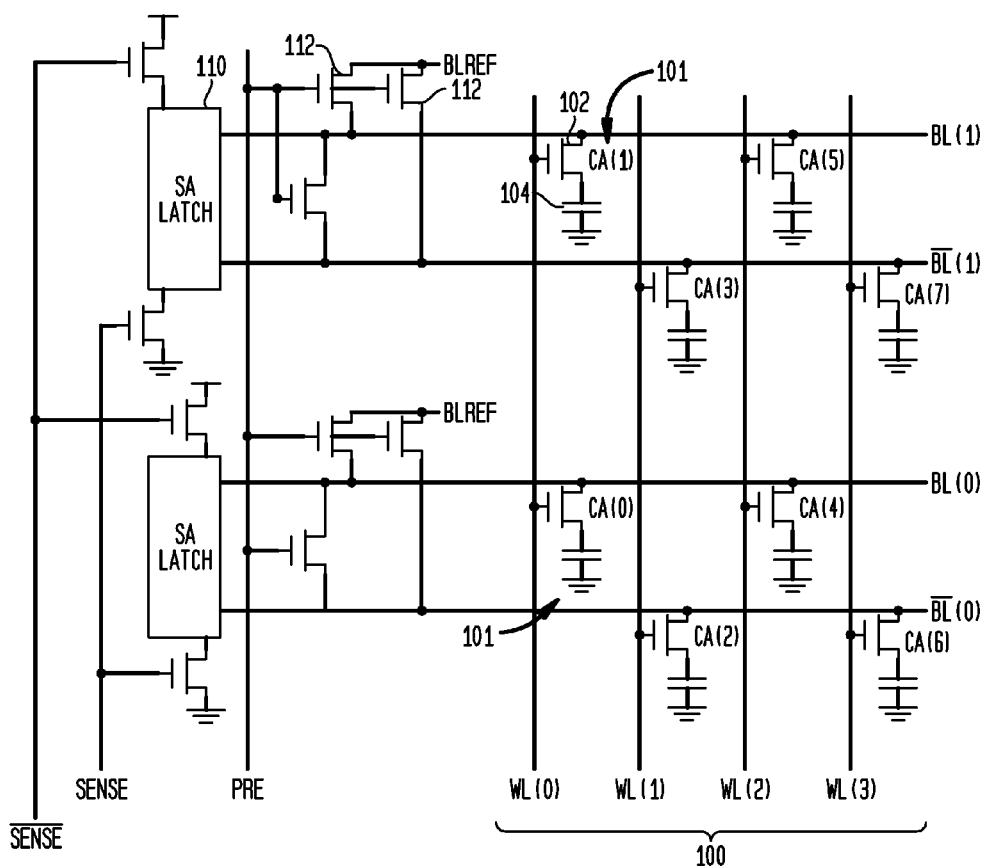
FIG. 1 is a schematic block and circuit diagram illustrating a circuit organization of a dynamic random access memory ("DRAM") in accordance with an embodiment of the invention.

FIG. 1 illustrates the structure of a typical memory 102 including a dynamic random access memory ("DRAM") memory array 100. The memory typically is embodied in a semiconductor chip as a "DRAM chip" having predominant function to provide a DRAM storage array. Alternatively, the memory can be a DRAM macro, a functional unit embodied in a chip which also includes other functional circuitry such as logic circuitry incorporated on the same semiconductor chip. In the example shown in FIG. 1, a memory cell 101 of the DRAM array 100 can include a transistor 102 and a data storage element 104. The transistor can be a metal oxide semiconductor field effect transistor ("MOSFET"), typically an n-type MOSFET or ("NFET"), for example. The data storage element 104 typically is a capacitor having a first plate or "cell node" connected to the source of the NFET, and a second plate at a reference level or ground Vss of the chip.

The DRAM array has bitlines (BL<0>, /BL<0>, BL<1>, /BL<1> extending in a first direction across the array. The bitlines connect to the NFET transistors of the memory cells at electrodes, i.e., the drains thereof, which are opposite the electrodes of the sources to which capacitors 104 can be connected. Wordlines WL<0>, WL<1>, WL<2>, and WL<3> extend in a second direction transverse to the first direction. In the DRAM array 100 as shown in FIG. 1, typically only one wordline can be activated at one time. When a wordline is activated, such as WL<0>, the transistors 104 in memory cells 101 coupled to such wordline WL<0> turn on, allowing charge to flow between the data storage elements and the respective bitlines to which the transistors of the respective memory cells are connected.

FIG. 1 further shows additional circuitry of the DRAM for performing read, write and refresh operations, among which are sense amplifiers ("SA Latch"s) 110, and precharge devices 112 and equalization device 113 (collectively, "precharge") devices. The sense amplifiers can be used to amplify small swing signals on the bitlines to rail-to-rail signals at a supply voltage level Vcc and at a reference voltage Vss such as ground for representing "1"s and "0"s on data output from or input to the DRAM. In one example, the sense amplifiers can amplify signals having a signal swing less than 100 millivolts to signals which swing between a reference voltage level Vss or ground at 0.0 V, and a supply voltage level of 1.0 V.

The precharge devices 112 are coupled to a precharge supply voltage BLREF and to the bitlines. When active, the precharge devices charge the bitlines to the predetermined voltage level of BLREF. When inactive, the precharge devices are off, the BLREF voltage level is disconnected from the bitlines.

Figure 2:
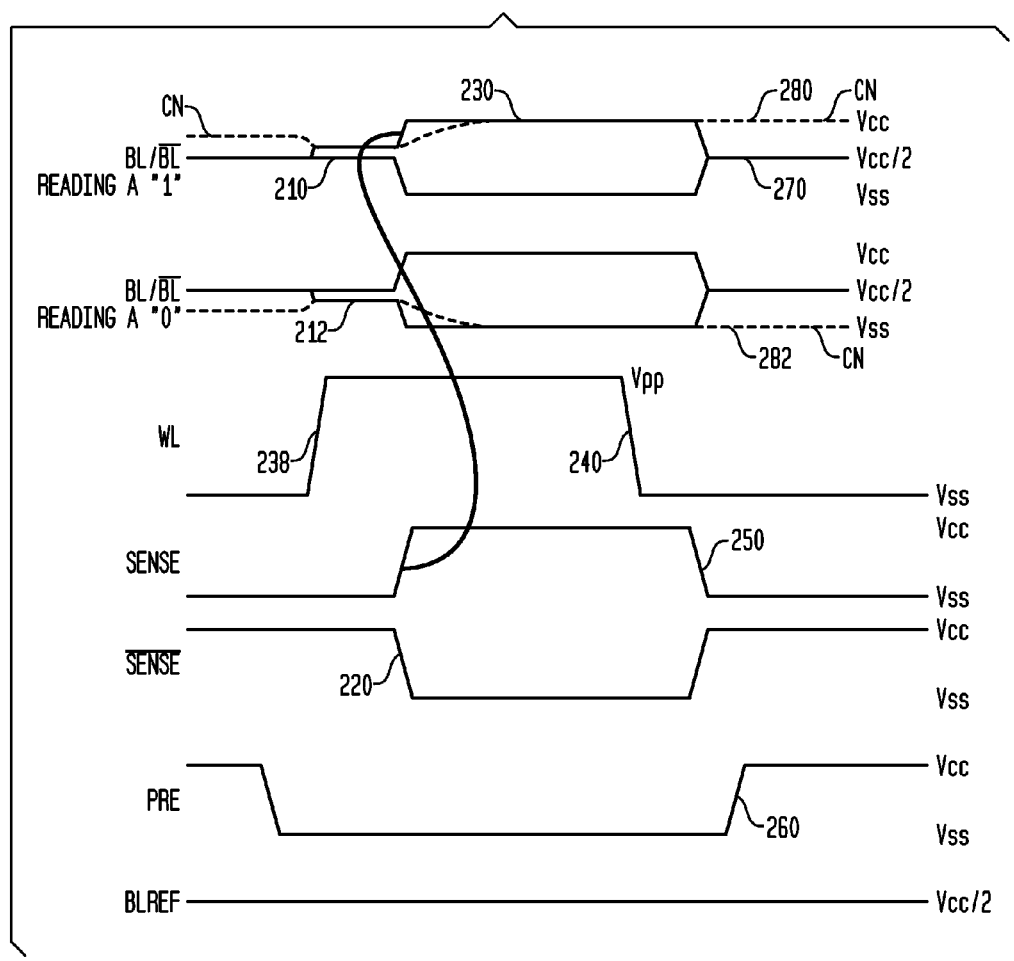
FIG. 2 is a timing diagram illustrating conventional operation of a DRAM.

An example of operation of a DRAM which is used as a reference for the following description is depicted in FIG. 2. Such operation, which is believed to be conventional, is not claimed herein and is only described in order to better show the differences between the claimed invention and that which is believed to be conventional.

FIG. 2 is a timing diagram showing the states of various signals including data signals and control signals and a reference voltage (BLREF) during an operation to read, refresh or restore data in memory cells coupled to a wordline of the memory array. In the timing diagram, each position from the left edge of the figure on each graph corresponds to the same point in time as the same position from the left edge on every other graph. Therefore, a vertical line on the figure which runs through all of the signals from the BL, /BL graph at the top of the figure to the BLREF at the bottom represents the same point in time as to all of the graphs.

Referring to FIGS. 1 and 2, in conventional operation, precharge devices 112 are set to active states by a PRE control signal to precharge the bitlines connected to those precharge devices to a bitline reference (BLRFEF) voltage level. After precharging the bitlines, the precharge devices are deactivated, i.e., set to inactive states. In one example, the BLREF voltage level can be Vcc/2 as seen in FIG. 2 which can be an intermediate level between the supply voltage level (Vcc) and the reference level or ground (Vss). In one example, Vcc/2 can be precisely halfway between the reference level Vss and Vcc.

Then, at 238 the wordline is activated, i.e., the wordline is switched to an active state, as seen in the rise of the WL voltage to Vpp. The voltage level Vpp typically is higher than the voltage level Vcc used for storing a "1" in a memory cell of a transistor. A higher voltage level Vpp helps turn on transistors 102 with sufficient headroom, such that during normal read, write and refresh operations, the Vcc voltage level can pass to data storage elements, e.g., storage capacitors, of the memory cells. Once the wordline is activated, the transistors 102 turn on, allowing charge to flow between the data storage elements 104 and the respective bitlines to which they are connected. Normally, this flow of charge causes a signal to develop on a bitline connected to the memory cell through the corresponding transistor. In FIG. 2, the graph at 210 illustrates a signal development for a "1" stored in the memory cell. Specifically, a small swing 210 is observed in the voltage level rising on the bitline from the original BLREF level which in this case is Vcc/2. Conversely, when a "0" is stored in the memory cell, as seen at 212 the small signal swing is downward from the BLREF level, i.e., downward from Vcc/2.

Once the signal has developed on the bitline, the sense amplifier coupled to the bitline is activated by the transitions of the signals SENSE and /SENSE to the opposite levels at 220. When activated, the sense amplifier amplifies the signal on the bitline coupled thereto to either of the respective supply voltage level (Vcc) or the reference level or ground (Vss). Such signal then can be stored again the memory cell, or otherwise transferred to a data input output bus of the DRAM. As seen at 230 in FIG. 1, the sense amplifier amplifies the signal levels on the bitlines BL and /BL to Vcc and Vss. Once the signals on the bitlines have been amplified to Vcc and Vss, they can be restored in the memory cells for access again at a later time. As seen at 240, the wordline is deactivated, and then subsequently at 250 the sense amplifier is deactivated. Finally, at 260 PRE becomes active again to precharge the bitlines for the next read, refresh or restore operation, or a write operation to the DRAM array. Thus, once the precharge devices 112 are active again, the voltages on the bitlines return to Vcc/2 at 270. However, as seen in the dashed line at 280 marked "CN", when a "1" is stored in the memory cell, the voltage stored in the memory cell can be at Vcc. Alternatively, when a "0" is stored, as shown at 282, the stored voltage in the memory cell can be at Vss.

It will be understood that amplification of signals on bitlines is performed simultaneously by each of a plurality of sense amplifiers connected to the bitlines coupled to memory cells on the same wordline in the DRAM array. Thus, the data in memory cells on the same wordline can be read, refreshed or restored simultaneously.

Figure 3:
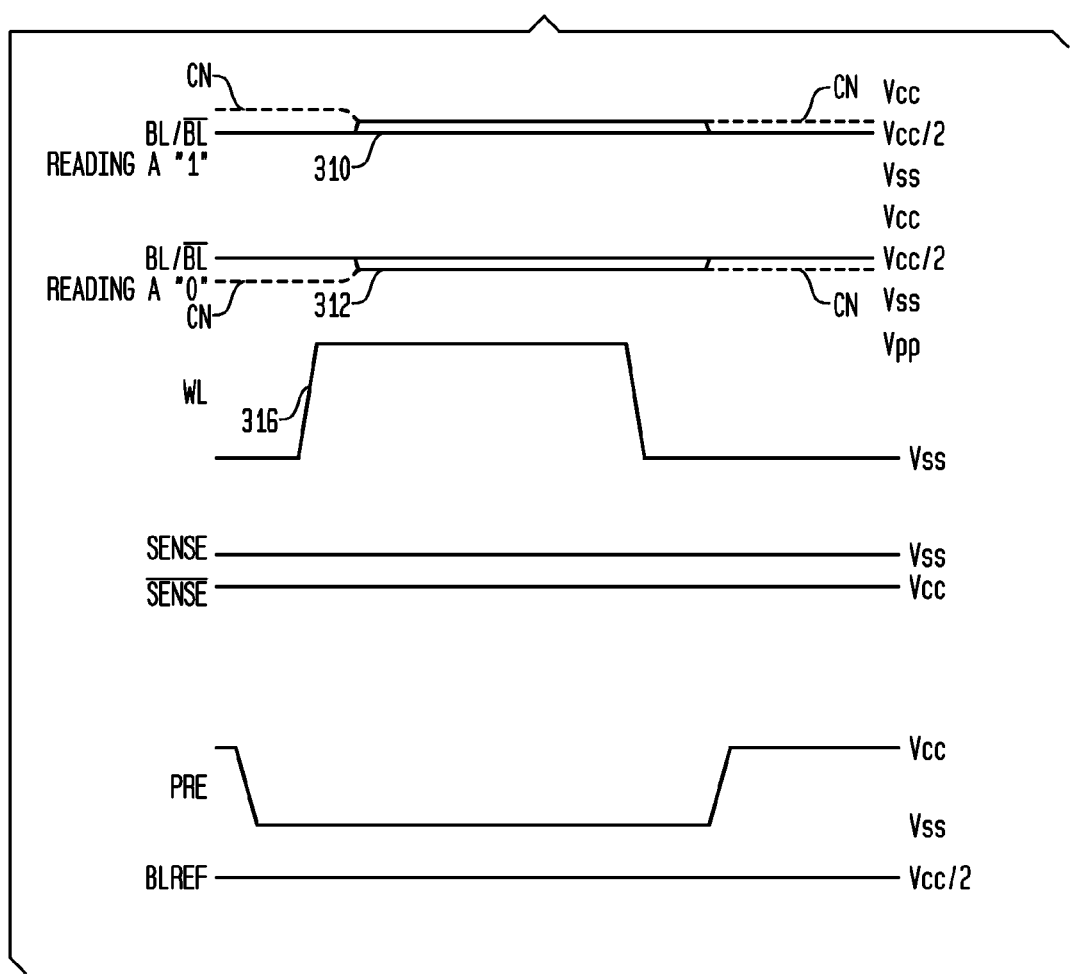
FIG. 3 is a timing diagram illustrating operation of a DRAM in a method of erasing data according to one embodiment of the invention.

FIG. 3 illustrates operation according to a method of erasing data stored in a dynamic random access memory according to a first embodiment of the invention. In this embodiment, in a special mode of operation for erasing stored data, the activation of the wordline and the control signal PRE provided to the memory are the same as described relative to FIG. 2. However, the control signals SENSE and /SENSE provided to the sense amplifiers are disabled, such that the sense amplifiers 110 (FIG. 1) stay inactive during the interval in which the wordline is active.

Thus as seen in FIG. 3, when the wordline (WL) is activated at time 316 the sense amplifiers are inactive and remain inactive throughout the time the wordline is active. As described above, charge may flow between the bitline an the memory cell coupled thereto, which in turn can cause a signal to develop on the bitline as seen at 310 for a stored "1" in the memory cell. Alternatively, as seen at 312 a signal may develop which corresponds to a stored "0" in the memory cell.

However, because the sense amplifier is inactive throughout the time the wordline is active, the sense amplifier does not amplify the signal thereon to a storable signal level. Moreover, since charge stored in the memory cell of either "1" or "0" polarity has flowed onto the bitline when the wordline is active, insufficient charge remains in the memory cell to reliably represent a data bit. Therefore, when the wordline becomes inactive again, the charge remaining in the memory cell no longer is sufficient to represent either a "1" or a "0", and the data bit stored in the memory cell has been erased.

The method represented in FIG. 3 can be performed using a wordline of a memory (DRAM) array to erase the data stored in the memory cells coupled to such wordline, and the method can then be repeated as to another wordline of the memory array to erase the data stored in memory cells coupled to the other wordline. This method can be repeated, in turn, using each of a remaining number of wordlines of a selected range (for example, a row address range) of the memory array to erase the data throughout the selected range of the memory array. In one example, the selected range can be the entire memory array, such that, in that case the method erases the data stored in the entire memory array, i.e., erases all of the data stored in all of the memory cells of the memory array. Alternatively, a range of the memory array which is less than the entire memory array, and which comprises any number of wordlines can be selected such that the method can be used to erase only the data stored in the selected range of the memory array. In particular examples, the selected range is more than a few wordlines, for example, a range encompassing a number of wordlines, e.g., 7, 8, 10, 20, 43, 56, 64, 100 or 128 wordlines of the memory array, but which is less than the total number of operational wordlines corresponding to the capacity of the entire memory array. Thus, the selected range will include only a subset of the operational wordlines, such that only a portion of the DRAM array having less than the entire capacity of the DRAM array is selected, and another portion of the same DRAM array corresponding to unselected operational wordlines of the DRAM array is left unselected.

In this case, "operational" wordlines are wordlines which are currently available for storage of data in the memory cells coupled thereto. Operational wordlines do not include wordlines currently used for other purposes such as merely being available as redundancy replacement wordlines in the event they are needed to replace operational wordlines of the DRAM array, or in another example, wordlines which are used for monitoring delays across the DRAM array. The selected range can comprise a number of wordlines which in one case, is a power of 2, or in another case a number of wordlines which is not a power of 2.

In a particular embodiment, an address counter, which in some cases can be a refresh address counter 630 as described below relative to FIG. 6, can be used to select each wordline to which the erasing method will be applied. In this case, the address counter can cycle through a series of row addresses from a beginning row address of a selected row address range to a final row address thereof. The row address 620 then is provided as output of the address counter 630 to one or more row decoders 615 which then select and drive a selected wordline of the DRAM array which corresponds to the current row address. Typically, the address counter cycles through a series of consecutive row addresses starting with the beginning row address until it reaches the final row address of the selected row address range. In this way, a selected range of the DRAM array can be erased.

In a particular embodiment, the method can be performed using wordlines which do not make up a contiguous range of the memory array. For example, one out of every two wordlines of the memory array, or one out of every three wordlines of the memory array can be selected to perform the method to erase the data stored in the memory cells coupled to those selected wordlines, without erasing the data stored in memory cells coupled to the non-selected wordlines. In another example, this method could be performed using one wordline out of every few wordlines, instead of one out of every two or three wordlines. Such way of performing the method might improve the speed of the erasing process when data is organized in active system memory in such way that partial erasure of the data stored in the memory cells coupled to one out of each two, three or some other number of wordlines, makes the remaining stored data unusable.

Figure 4:
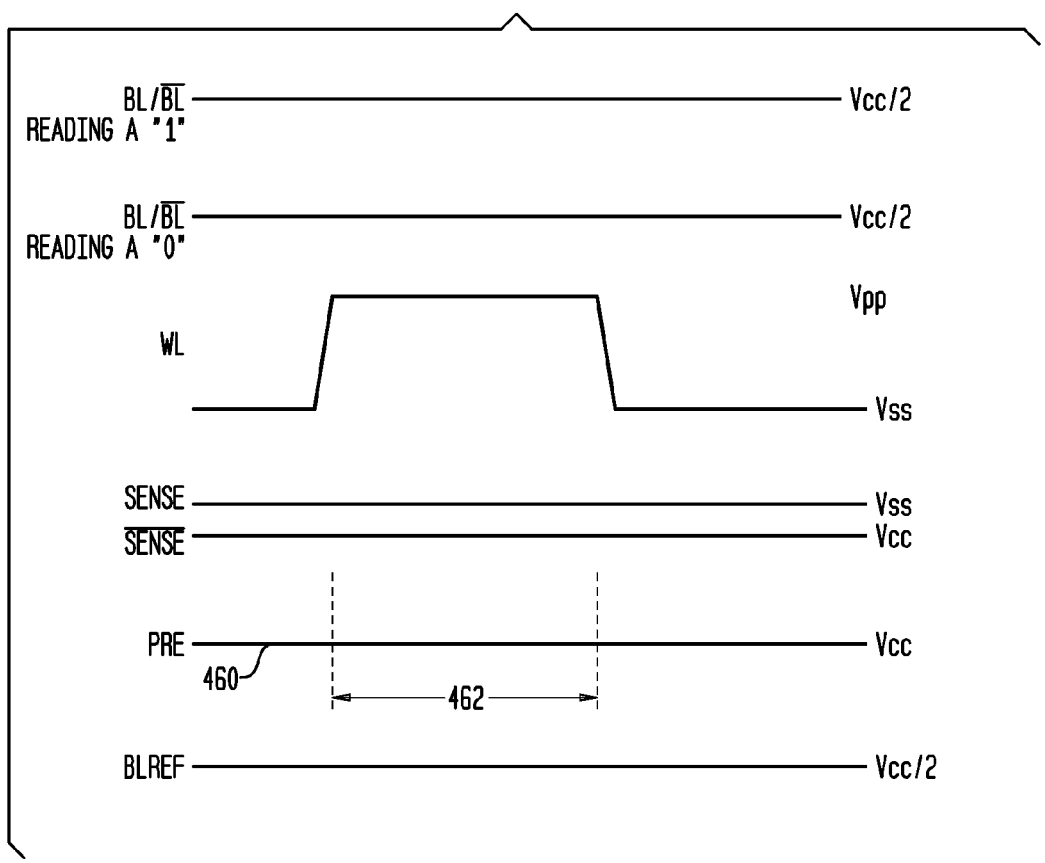
FIG. 4 is a timing diagram illustrating operation of a DRAM in a method of erasing data according to one embodiment of the invention.

FIG. 4 illustrates operation according to a further embodiment of the invention. In this embodiment, like that of FIG. 3, the sense amplifiers remain inactive during the period of time in which the wordline is active. However, as seen at 460, the PRE control signal also remains high throughout the interval 462 that the wordline is active so as to set the voltage level on each of the bitlines BL and /BL to a predetermined voltage level BLREF such as Vcc/2. As a result, the memory cells coupled to the wordline store charge according to the predetermined voltage level, e.g., Vcc/2 rather than the data previously stored therein. In this way, the data previously stored in the memory cells has been erased. The techniques described above relative to FIG. 3 and FIG. 6 can also be applied here to erase data stored in the entire DRAM array or erase data only in a selected range of the DRAM array.

Figure 5:
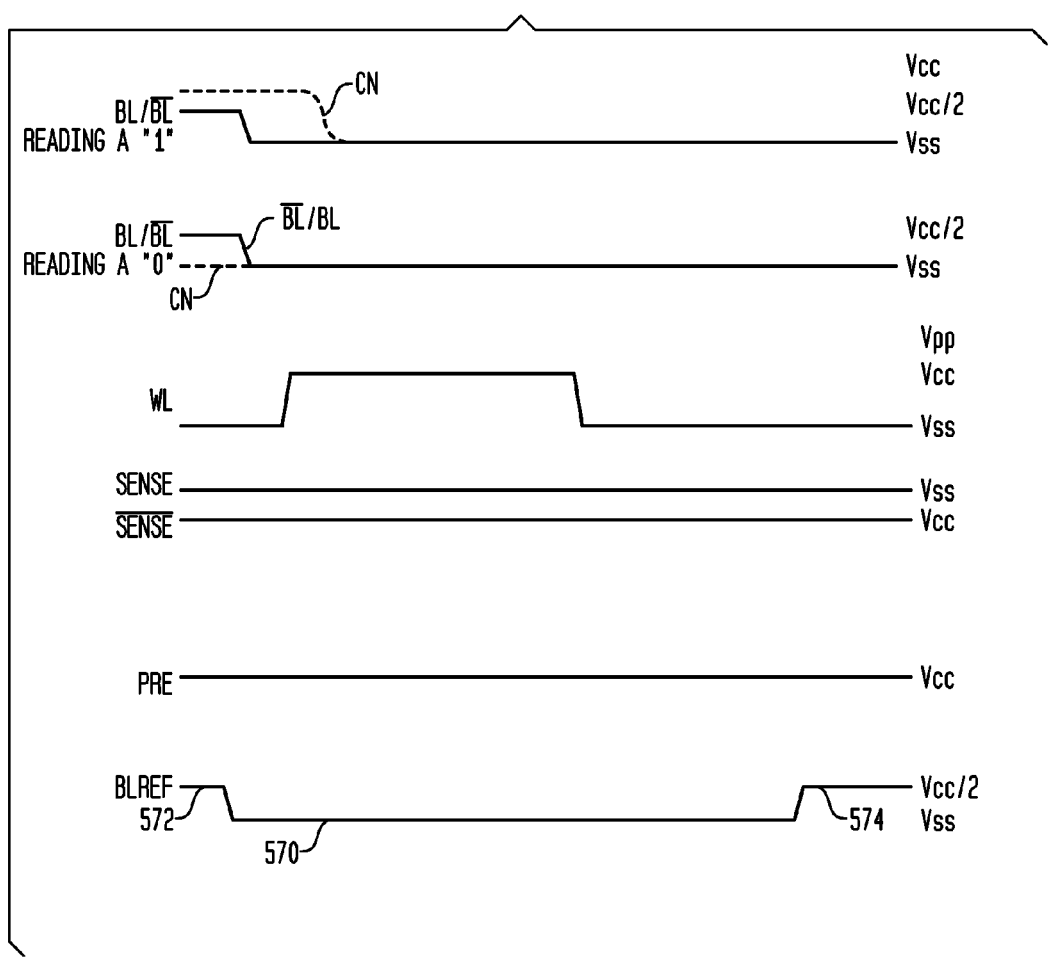
FIG. 5 is a timing diagram illustrating operation of a DRAM in a method of erasing data according to one embodiment of the invention.

FIG. 5 illustrates operation according to a variation of the embodiment described above with respect to FIG. 4. As in the FIG. 4 embodiment, the PRE control signal remains high throughout the interval in which the wordline is active. However, in this variation the bitlines BL and /BL are set to a reference voltage level or ground (Vss) instead of Vdcc/2. Such operation can be achieved by varying the BLREF level supplied to the precharge devices 112 in accordance with a control signal (not shown). For example, BLREF can be set to a different level 570 such as Vss when the erasing operation is performed. In this way, the bitlines BL and /BL are then each held at a predetermined voltage level BLREF such as Vss, and the memory cells coupled to the wordline store charge according to that predetermined voltage level, e.g., Vss, thus writing the memory cells with the predetermined voltage level. Thus, when BLREF is set to a reference voltage level, e.g., ground Vss, which represents a "0", the erasing operation stores "0"s in the memory cells coupled to the wordline.

As further depicted in FIG. 5, during normal operation as described above relative to FIGS. 1 and 2 in which the memory performs normal read, write and refresh operations, BLREF can be at a level 572 such as Vcc/2 which is between the supply voltage level and the reference level. For example, level 572 can be halfway between the supply voltage level Vcc and a reference level Vss such as ground. Then, when the memory is set to a special mode for erasing previously stored data as described above relative to FIG. 5, BLREF can be set to the special level 570 such as a reference voltage level or ground (Vss). FIG. 5 further depicts at 574 the change in BLREF back to the intermediate level Vcc/2 for normal operation. The techniques described above relative to FIG. 3 and FIG. 6 can also be applied here to erase data stored in the entire DRAM array or erase data only in a selected range of the DRAM array.

In another variation of the above-described operation, the BLREF level can switch to be set to the intermediate level Vcc/2 during normal operation, and can be set to a supply voltage level the other logic level voltage such as Vcc when the memory is set to the special mode for erasing stored data.

In a further example of operation shown in FIG. 5, in a particular embodiment, optionally the wordline voltage WL can be raised only to the power supply voltage level Vcc rather than to the higher power supply voltage level Vpp as described above relative to FIG. 2. In this case, raising the wordline voltage WL to the voltage level Vcc may sufficiently turn on the memory cell transistors (e.g., transistors 102 FIG. 2) to allow the voltage level Vss to pass to data storage elements, e.g., storage capacitors 104.

Figure 6:
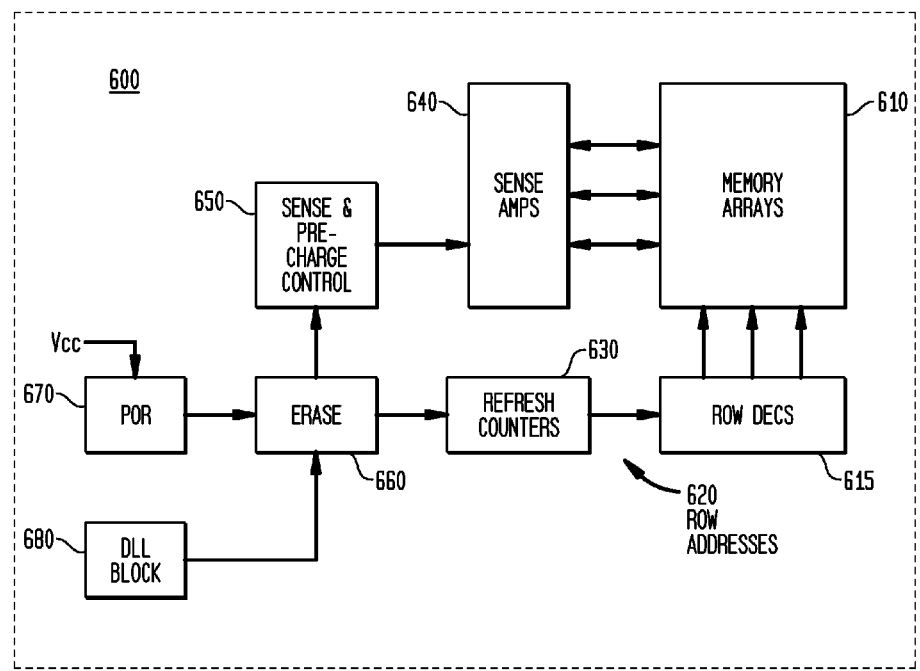
FIG. 6 is a block diagram illustrating a functional organization of a DRAM chip or DRAM macro functional unit of a chip in accordance with an embodiment of the invention.

FIG. 6 depicts a memory 600 such as may be embodied in a single semiconductor chip or a portion of a semiconductor chip. The memory includes at least one dynamic random access memory array 610 having row decoder and wordline driver circuits ("ROW DECS" 615) configured to set particular wordlines of the array to active states at positions corresponding to row address signals 620. As seen in FIG. 6, the row address signals 620 may be received from an address counter, e.g., one or more refresh address counters 630, or "refresh counters". SENSE AMPS 640 include the sense amplifier latch 110 ("SA Latch") described above with respect to FIG. 1, as well as the associated precharge and equalization devices 112, 113.

The methods according to the embodiments of the invention described relative to FIGS. 3, 4 and 5 above can be implemented using control logic as follows. The logic block "SENSE & PRE-CHARGE CONTROL" 650 can be used to vary the operations of the sense amplifier latches, precharge devices and vary the bitline reference voltage BLREF supplied thereto during the normal and special operational modes. Thus, when block 650 is active, an erasing method can be performed as described above with respect to one of FIG. 3, 4, or 5. When block 650 is not active, normal read, write and refresh operations can be performed to the DRAM array 610.

An ERASE control block 660 can control when the SENSE & PRE-CHARGE CONTROL block 650 is active so as to control when the memory enters and exits the special mode of operation for erasing stored data. In a particular implementation, the ERASE control block can enter the special erasing mode of operation upon receiving a signal from power-on-reset ("POR") logic 670, causing the memory to undergo a power-on-reset, which in such case, can cause an erasing method to be performed as described above relative to FIG. 3, 4 or 5.

Alternatively, using one or more signals from a part of a system external to the memory 600, the POR logic may detect that the system in which the memory is installed is undergoing power-on-reset, and then cause an erasing method to be performed as described above relative to FIG. 3, 4 or 5. The ERASE control block may also set the memory to the special erasing mode upon detecting that the system in which the memory is installed is being turned off or is entering a quiescent state such as sleep mode or hibernation mode. In that way, setting the system to the sleep mode or hibernation mode causes the DRAM chip to automatically an erasing method to be performed as described above relative to FIG. 3, 4 or 5.

The ERASE control block may further receive a signal from a DLL block 680 for causing the memory to be placed in the special erasing mode upon occurrence of one or more other conditions, and then cause an erasing method to be performed as described above relative to FIG. 3, 4 or 5.

The memory 600 can be incorporated within a system such as a computer, such as a desktop, laptop or tablet computing system, smartphone, or other electronic device, wherein a signal from a part of the system external to the memory 600 can be input to the memory to control when the memory enters or exits the special mode of operation for erasing stored data.

Figure 7:
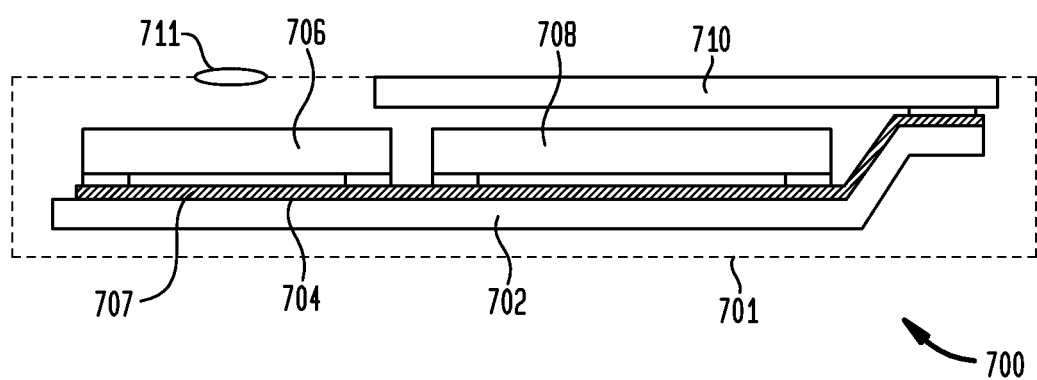
FIG. 7 illustrates organization of a system which can incorporate a DRAM chip or chip including a DRAM macro according to an embodiment of the invention.

Merely by way of example and without limitation to the examples discussed above, the following combinations of chips may be included in microelectronic packages or higher-level assemblies which include a DRAM chip having features as discussed above: (i) a processor and memory used with the processor; (ii) plural memory chips of the same type; (iii) plural memory chips of diverse types, such as DRAM and SRAM; (iv) an image sensor and an image processor used to process the image from the sensor; (v) an application-specific integrated circuit ("ASIC") and memory. The structures discussed above can be utilized in construction of diverse electronic systems. For example, a system 700 in accordance with a further embodiment of the invention includes a novel DRAM chip 706 as described above in conjunction with other electronic components 708 and 710. In the example depicted, component 708 is a semiconductor chip whereas component 710 is a display screen, but any other components can be used. Of course, although only two additional components are depicted in FIG. 7 for clarity of illustration, the system may include any number of such components. The DRAM chip 706 may be, for example, a DRAM chip according to FIG. 6, which may be configured to operate according to a method discussed above in connection with any of FIG. 3, 4 or 5. In a further variant, two or more DRAM chips can be used, and DRAM chips can be provided which are configured to operate according to more than one of the above-discussed methods, or a combination of DRAM chips can be provided which are configured to operate according to one or more of the above-discussed methods in the respective DRAM chips. DRAM chip 706 and components 708 and 710 are mounted in a common housing 701, schematically depicted in broken lines, and are electrically interconnected with one another as necessary to form the desired circuit. In the exemplary system shown, the system includes a circuit panel 702 such as a flexible printed circuit panel or circuit board, and the circuit panel includes numerous conductors 707, of which only one is depicted in FIG. 7, interconnecting the components with one another. However, this is merely exemplary; any suitable structure for making electrical connections can be used. The housing 701 is depicted as a portable housing of the type usable, for example, in a cellular telephone, tablet computing system, electronic reader or personal digital assistant, and screen 710 is exposed at the surface of the housing. Where DRAM chip 706 is packaged or mounted in housing 701 which also incorporates a light-sensitive element such as an imaging chip (not shown), a lens 711 or other optical device also may be provided for routing light to the imaging chip. Again, the simplified system shown in FIG. 7 is merely exemplary; other systems, including systems commonly regarded as fixed structures, such as desktop computers, routers and the like can be made using the structures discussed above.

Although the invention herein has been described with reference to particular embodiments, it is to be understood that these embodiments are merely illustrative of the principles and applications of the present invention. It is therefore to be understood that numerous modifications may be made to the illustrative embodiments and that other arrangements may be devised without departing from the spirit and scope of the present invention as defined by the appended claims.

The invention claimed is:

1. A method of erasing data stored in a dynamic random access memory (DRAM) array, comprising:
    (a) setting a wordline of the DRAM array to an active state, thereby causing charge to flow between memory cells coupled to the wordline and respective bitlines according to the data stored in the memory cells, wherein signals develop on the respective bitlines according to the flows of charge between the memory cells coupled to the wordline and the respective bitlines; and
    (b) while maintaining sense amplifiers connected to the respective bitlines in inactive states in which the sense amplifiers do not amplify the signals to storable signal levels, setting the wordline to an inactive state such that insufficient charge remains in the memory cells coupled to the wordline, thereby erasing the data stored in the memory cells coupled to the wordline,
    wherein the sense amplifiers are maintained in the inactive states by a control block operating in an erasing mode in a state that at least one predefined event is detected, and the sense amplifiers are operated normally for read, write and refresh operations by the control block operating in a normal mode in a state that none of the at least one predefined event is detected.

2. The method as claimed in claim 1, wherein setting the wordline to the active state is performed by raising a voltage of the wordline to a voltage level that is higher than a voltage level used for storing a "1" in a memory cell of the DRAM.

3. The method as claimed in claim 1, wherein setting the wordline to the active state is performed by raising a voltage of the wordline to a power supply voltage level Vpp.

4. The method as claimed in claim 1, wherein setting the wordline to the active state is performed by raising a voltage of the wordline to a voltage level that is the same as a voltage level used for storing a "1" in a memory cell of the DRAM.

5. The method as claimed in claim 4, wherein the voltage of the wordline is raised to a power supply voltage level Vcc used for powering the DRAM.

6. The method as claimed in claim 1, wherein (a) and (b) are performed using each of a plurality of wordlines of an entire memory array so as to erase the data stored in the entire memory array.

7. The method as claimed in claim 6, wherein (a) and (b) are performed for a wordline of a selected range smaller than an entire memory array, and then (a) and (b) are repeated for each of a plurality of remaining wordlines of the selected range.

8. The method as claimed in claim 7, wherein (a) includes selecting the wordline using a refresh address counter.

9. The method as claimed in claim 1, further comprising precharging the bitlines to a first voltage level before step (a).

10. The method as claimed in claim 9, wherein the first voltage level is an intermediate level between a high signal voltage level and a low signal voltage level at which "1"s and "0"s, respectively, are stored in the memory cells coupled to the wordline.

11. The method as claimed in claim 9, wherein the step of precharging the bitlines is performed by setting precharge devices connected to the bitlines to active states, the method further comprising maintaining precharge devices connected to the bitlines in inactive states during the maintaining of the sense amplifiers in the inactive states.

12. A memory including a dynamic random access memory (DRAM) array, comprising:
    a DRAM array having memory cells, wordlines and bitlines coupled to the memory cells; and
    sense amplifiers,
    the memory being configured to perform a method of operation including:
    (a) setting a wordline of the DRAM array to an active state, thereby causing charge to flow between memory cells coupled to the wordline and respective bitlines according to the data stored in the memory cells, wherein signals develop on the respective bitlines according to the flows of charge between the memory cells coupled to the wordline and the respective bitlines; and
    (b) while maintaining sense amplifiers connected to the respective bitlines in inactive states in which the sense amplifiers do not amplify the signals to storable signal levels, setting the wordline to an inactive state such that insufficient charge remains in the memory cells coupled to the wordline, thereby erasing the data stored in the memory cells coupled to the wordline,
    wherein the sense amplifiers are maintained in the inactive states by a control block operating in an erasing mode in a state that at least one predefined event is detected, and the sense amplifiers are operated normally for read, write and refresh operations by the control block operating in a normal mode in a state that none of the at least one predefined event is detected.

13. The memory as claimed in claim 12, wherein setting the wordline to the active state is performed by raising a voltage of the wordline to a voltage level that is higher than a voltage level used for storing a "1" in a memory cell of the DRAM.

14. The memory as claimed in claim 12, wherein the voltage of the wordline is raised to a power supply voltage level that is the same as a voltage level used for storing a "1" in a memory cell of the DRAM.

15. The memory as claimed in claim 12, wherein (a) and (b) are performed using each of a number of wordlines of an entire memory array so as to erase the data stored in the entire memory array.

16. The memory as claimed in claim 12, wherein (a) and (b) are performed using each of a number of wordlines of a selected range of the memory array smaller than an entire memory array so as to erase the data stored in the selected range.

17. The memory as claimed in claim 12, further comprising precharging the bitlines to a first voltage level before performing (a).

18. The memory as claimed in claim 12, wherein the first voltage level is an intermediate level between a high signal voltage level and a low signal voltage level at which "1"s and "0"s, respectively, are stored in the memory cells coupled to the wordline.

19. The memory as claimed in claim 12, wherein the precharging the bitlines is performed by setting precharge devices connected to the bitlines to active states, and the memory is further configured to maintain precharge devices connected to the bitlines in inactive states during the maintaining of the sense amplifiers in the inactive states.

20. The memory as claimed in claim 12, wherein the memory is configured such that setting the wordline to the active state comprises raising a voltage of the wordline to a power supply voltage level Vpp.

* * * * *